United States Patent [19]

Peet

[11] 4,015,071
[45] Mar. 29, 1977

[54] MICROELECTRONIC CIRCUIT CASE
[75] Inventor: Robert L. Peet, Yorba Linda, Calif.
[73] Assignee: Bliss & Laughlin Ind., Inc., Anaheim, Calif.
[22] Filed: June 5, 1975
[21] Appl. No.: 584,105
[52] U.S. Cl. .............................. 174/52 S; 219/105; 220/DIG. 29
[51] Int. Cl.² ......................................... H05K 5/06
[58] Field of Search ............... 174/50, 52 FP, 52 S; 219/93, 105, 107, 83; 220/359, 75, DIG. 29, DIG. 31; 228/110, 111, 112, 114, 115, 116, 117; 29/DIG. 48

[56] References Cited
UNITED STATES PATENTS

| | | | |
|---|---|---|---|
| 1,857,505 | 5/1932 | Heineman | 219/105 X |
| 2,285,609 | 6/1942 | Pederson | 219/93 |
| 2,880,383 | 3/1959 | Taylor | 174/52 FP UX |
| 2,968,713 | 1/1961 | Harper | 219/93 |
| 3,190,952 | 6/1965 | Bitko | 174/52 FP |
| 3,195,026 | 7/1965 | Wegner et al. | 174/52 FP X |

*Primary Examiner*—Joseph V. Truhe
*Assistant Examiner*—D. A. Tone
*Attorney, Agent, or Firm*—Harris, Kern, Wallen & Tinsley

[57] ABSTRACT

A microelectronic circuit case for continuous seam welding to a lid and having a chamfer on the inner corner of the case upper edge for improving welding and sealing reliability, and a method of making the case.

2 Claims, 4 Drawing Figures

U.S. Patent    Mar. 29, 1977    4,015,071
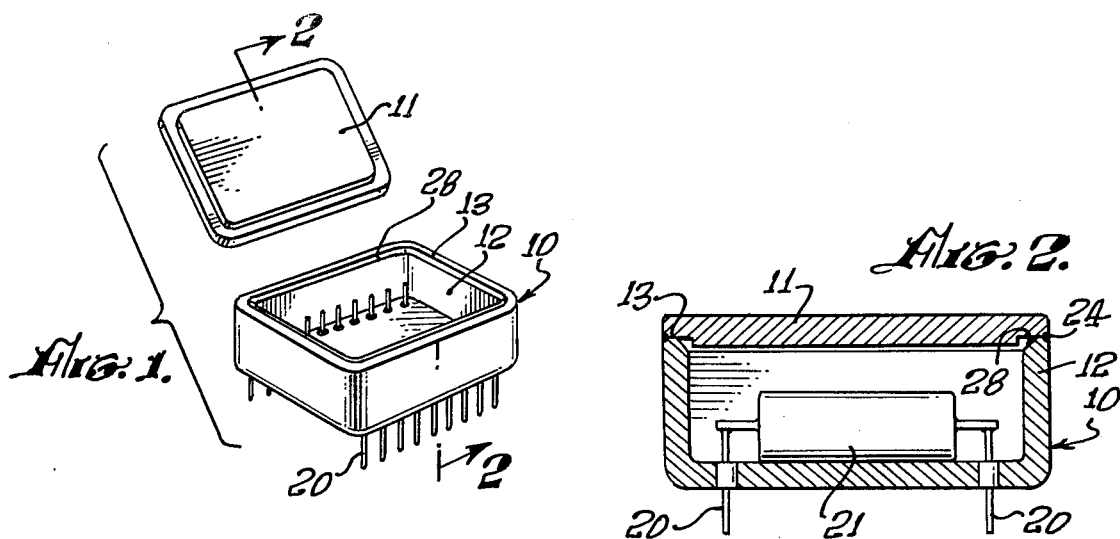
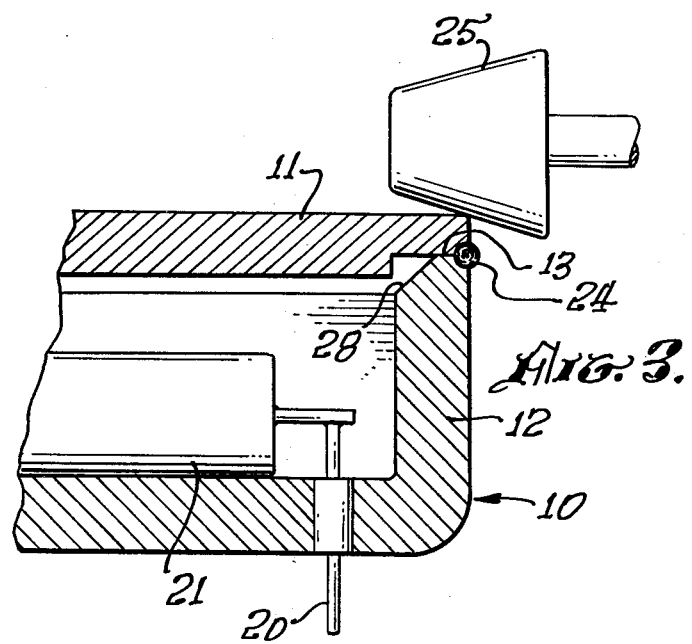
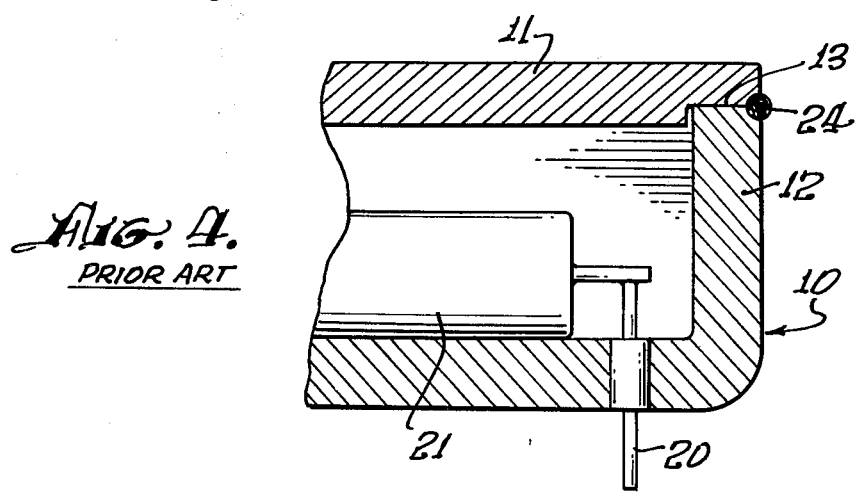

MICROELECTRONIC CIRCUIT CASE

This invention relates to microelectronic circuit packages and in particular to a new and improved case for a microelectronic circuit package. Microelectronic circuits, such as integrated circuit chips, substrates and the like, are packaged in a variety of configurations. One widely used technique is to mount the circuit component in a metal case with a plurality of feedthrough conductors and weld a lid to the case to provide a hermetic seal. The cases are quite small, typically in the order of ½ inch by 1 inch by ⅛ inch. The circuit components are produced in large quantities and there is a continuous demand for more rapid packaging techniques and less expensive packages. Where hermetic sealing is required, the rejection rate due to poor welding of the lid to the case has been relatively high. Continuous seam welding is employed in automatic high-speed welding operations and it is an object of the present invention to provide a new and improved microelectronic circuit case suitable for use in continuous seam welding of lids. A further object is to provide such a case which can be utilized in achieving greater uniformity in welding and a substantial reduction in rejection rate for welded packages. Another object is to provide a new and improved process for making cases.

The cases and lids for the microelectronic circuit packages normally are made of an iron-nickel-cobalt alloy ASTM Spec F-15, or steel and a variety of techniques have been tried for achieving the desired uniformity in hermetic sealing of case and lid. Thermocompression bonding, ultrasonic bonding and one-step welding have been utilized in addition to the seam welding technique. The cases typically have been manufactured by drawing from a sheet and then trimming and lapping to obtain a flat upper edge for welding.

Other objects, advantages, features and results will more fully appear in the course of the following description.

In the drawing:

FIG. 1 is a perspective view of a microelectronic circuit case and lid;

FIG. 2 is a sectional view taken along the line 2—2 of FIG. 1 showing the lid in place on the case;

FIG. 3 is an enlarged view of a portion of the package of FIG. 2 incorporating the presently preferred embodiment of the invention; and FIG. 4 is a view similar to that of FIG. 3 showing the prior art construction.

FIGS. 1 and 2 show a case 10 with a lid 11. Typically the case is formed out of sheet stock by drawing. The case 10 functions as a container with upstanding sides 12 and an open top. The sides have an upper edge 13 which engages the lid 11. The lid may be formed by stamping or etching.

A plurality of leads or conductors 20 are provided in glass seals in the bottom of the case 10. A circuit component 21 is mounted in the case with the component leads connected to the conductors 20, after which the lid is placed in position and welded.

A continuous seam weld indicated at 24 is provided around the periphery of the lid in an automatic welding machine incorporating a rolling welding electrode 25. This welding operation is also conventional.

A case typically is made of metal 0.040 inches thick so that the upstanding sides 12 have a wall thickness of 0.040 inches. The prior art case configuration is shown in FIG. 4 with the upper edge 13 having a width corresponding to the thickness of the sides 12. The rejection rate for inadequate package sealing resulting from poor seam welds using the prior art configuration have been relatively high. It has been determined that superior seam welds can be achieved using a new case having a chamfer 28 at the inner corner of the upper edge 13, as best seen in FIG. 3. The chamfer typically is at 45°, and in the preferred embodiment, the chamfer is made sufficiently large such that the width of the upper edge 13 for engagement with the lid is in the order of one-fourth the thickness of the sides 12. For example, with a case formed of sheet stock 0.040 inches thick, the upper edge 13 will preferably have a width of about 0.010 inches. The chamfer 28 may be produced after the case is drawn by subsequent machining such as by grinding or milling. However it is preferred to form the chamfer during the case drawing operation and this is readily achieved by suitable design of the drawing dies.

In the prior art case, the flat upper edge usually is obtained by first trimming the drawn case and then lapping to produce the flat surface. In the preferred process for making the case of the invention, the upper edge is coined to the desired shape in the multi-step drawing operation, thereby eliminating the subsequent separate trimming and lapping steps. The feather like edge resulting from the drawing is coined to the flat and chamfer configuration, rather than being trimmed off.

I claim:

1. A microelectronic circuit case comprising a unitary metal container with an open top and upstanding sides having a smooth flat upper edge with a substantially square outer corner for continuous seam welding at the outer corner to a lid placed over the open top to form a hermetically sealed package, the improvement comprising a chamfer at the inner corner of said upper edge.

2. A case as defined in claim 1 wherein the width of said upper edge for engagement with the lid is in the order of one-quarter the thickness of said sides.

* * * * *